(12) United States Patent
Sekiguchi et al.

(10) Patent No.: US 7,693,198 B2
(45) Date of Patent: Apr. 6, 2010

(54) LASER DEVICE

(75) Inventors: Ryota Sekiguchi, Kawasaki (JP); Toshihiko Ouchi, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/742,627

(22) Filed: May 1, 2007

(65) Prior Publication Data

US 2007/0280319 A1 Dec. 6, 2007

(30) Foreign Application Priority Data

May 31, 2006 (JP) .............................. 2006-150923

(51) Int. Cl.
*H01S 5/00* (2006.01)

(52) U.S. Cl. .................. 372/45.01; 372/43.01; 372/96; 372/102; 372/50.11

(58) Field of Classification Search ............. 372/45.01, 372/43.01, 102, 96, 50.11
See application file for complete search history.

(56) References Cited

U.S. PATENT DOCUMENTS

| | | | | |
|---|---|---|---|---|
| 5,701,325 | A | 12/1997 | Ouchi et al. | 372/96 |
| 5,850,408 | A | 12/1998 | Ouchi et al. | 372/27 |
| 6,046,096 | A | 4/2000 | Ouchi | 438/510 |
| 6,055,251 | A | 4/2000 | Ouchi et al. | 372/28 |
| 6,055,257 | A * | 4/2000 | Baillargeon et al. | 372/46.01 |
| 6,089,442 | A | 7/2000 | Ouchi et al. | 228/180.1 |
| 6,222,868 | B1 | 4/2001 | Ouchi et al. | 372/50 |
| 6,301,282 | B1 * | 10/2001 | Capasso et al. | 372/46.01 |
| 6,320,691 | B1 | 11/2001 | Ouchi et al. | 359/237 |
| 6,477,286 | B1 | 11/2002 | Ouchi | 385/14 |
| 6,507,594 | B1 | 1/2003 | Furukawa et al. | 372/36 |
| 6,771,677 | B2 | 8/2004 | Furukawa et al. | 372/36 |
| 6,836,579 | B2 | 12/2004 | Ouchi | 385/14 |
| 6,970,612 | B2 | 11/2005 | Ouchi | 385/14 |

(Continued)

FOREIGN PATENT DOCUMENTS

EP 0 977 329 A2 2/2000

(Continued)

OTHER PUBLICATIONS

Brhlik, M. et al., "Resolution to the Supersymmetric CP Problem with Large Soft Phases via D-Branes", Physical Review Letters, The American Physical Society, vol. 83, No. 11, pp. 2124-2127, Sep. 13, 1999.

(Continued)

*Primary Examiner*—Minsun Harvey
*Assistant Examiner*—Kinam Park
(74) *Attorney, Agent, or Firm*—Fitzpatrick, Cella, Harper & Scinto

(57) ABSTRACT

A laser device including a gain medium that has a gain, a waveguide for propagating an electromagnetic wave, and a resonant structure comprised of the waveguide. The gain medium extends in the propagation direction, and is sandwiched, at the top and bottom surfaces in the thickness direction thereof, between a first cladding and a second cladding of negative dielectric constant media. The gain medium is provided with a lateral structure adjacent to at least one of the side surfaces thereof in the width direction perpendicular to the propagation direction and the thickness direction. The lateral structure includes a positive dielectric constant medium which is sandwiched, at its top and bottom surfaces in the thickness direction thereof, between the negative dielectric constant media. The waveguide is comprised of the gain medium, the lateral structure, the first cladding and the second cladding.

16 Claims, 9 Drawing Sheets

U.S. PATENT DOCUMENTS

| | | | |
|---|---|---|---|
| 7,292,744 | B2 | 11/2007 | Ouchi .................. 385/14 |
| 2005/0215031 | A1 | 9/2005 | Ouchi .................. 438/459 |
| 2005/0233490 | A1 | 10/2005 | Kasai et al. .............. 438/46 |
| 2007/0070358 | A1 | 3/2007 | Ouchi .................. 356/614 |
| 2007/0218376 | A1 | 9/2007 | Ouchi .................. 430/56 |
| 2007/0253660 | A1 | 11/2007 | Wang et al. .............. 385/5 |

FOREIGN PATENT DOCUMENTS

| | | |
|---|---|---|
| JP | 2000-138420 | 5/2000 |

OTHER PUBLICATIONS

Li, Zhi-Yuan et al., "Application of structural symmetries in the plane-wave-based transfer-matrix method for three-dimensional photonic crystal waveguides", Physical Review B 68, The American Physical Society, vol. 68, pp. 245117-1 to 245117-20 (2003).

Asada, Masahiro "Density-Matrix Modeling of Terahertz Photon-Assisted Tunneling and Optical Gain in Resonant Tunneling Structures", Japanese Journal of Applied Physics, The Japanese Society of Applied Physics, pp. 5251-5256, Sep. 2001.

European Official Communication and Search Report dated Aug. 16, 2007, regarding Application No. 07 10 7334.0-2222.

Biernacki, P. et al, "Impedance Matching of Laser Diodes Using Packaged Microstrip Lines: Active and Passive", LEOS '95 IEEE Laser and Electro-Optics Society $8^{th}$ Annual Meeting, Conference Proceedings (CAT. No. 95CH35739) New York, vol. 1, pp. 238 and 239, 1995.

Asada, M. "Optoelectronic Devices for Terahertz Amplification and Oscillation", LEOS '04 IEEE Laser and Electro-Optics Society $17^{th}$ Annual Meeting of the IEEE Rio Grande, Puerto Rico, Nov. 8 and 9, 2004, vol. 2, pp. 671 and 672.

Williams, B. S. et al., "Terahertz Quantum-cascade laser at $\lambda \approx 100$ Using Metal Waveguide for Mode Confinement", Applied Physics Letters, American Institute of Physics, vol. 83, No. 11, pp. 2124-2126, Sep. 12, 2003.

Unterrainer, K. et al. "Quantum Cascade Lasers with Double Metal-semiconductor Waveguide Resonators", Applied Physics Letters, American Institute of Physics, vol. 80, No. 17, pp. 3060-3062, Apr. 29, 2002.

Alton, J. et al. "Buried Waveguides in Terahertz Quantum Cascade Lasers Based on Two-dimensional Surface Plasmon Modes", Applied Physics Letters, American Institute of Physics, vol. 86, pp. 071109-1 to 071109-3, 2005.

\* cited by examiner

LASER DEVICE

BACKGROUND OF THE INVENTION

1. Field of the Invention

The present invention relates to a laser device, in particular, to a current injection type laser device for a frequency band ranging from a millimeter wave band to a terahertz wave band (30 GHz to 30 THz).

2. Description of the Related Art

As a new type semiconductor laser, a semiconductor laser called a quantum cascade laser which is based on a transition between energy levels (intersubband transition) of carriers in a certain energy band of a conduction band or a valence band has been known so far. An oscillation wavelength of the quantum cascade laser depends on an energy gap between two energy levels of optical transition. Thus, the oscillation wavelength can be selected from over a wide spectral range (for example, from a mid-infrared region to a terahertz band). At first, it was demonstrated that such a laser could be achieved by using a structure having a selected oscillation wavelength of 4.2 [μm] in the mid-infrared region. Recently, because there is a demand for an electromagnetic wave source of a terahertz wave band which is believed to be useful to bio-sensing and the like, there has been a development of a long wavelength laser in which the oscillation wavelength is shifted toward a longer wavelength from a mid-infrared region.

A long wavelength laser should have a structure which is provided with a gain medium for producing a gain within the frequency range, and achieve an optical confinement to the gain medium; for, a gain medium may have a layer thickness on the order of 1 [μm] to 10 [μm] at most, and a gain medium for a typical long wavelength laser has a thickness which is $\frac{1}{10}$ or less of that of an oscillation wavelength. An approach for optical confinement by conductive cladding is known in the field of conventional semiconductor laser, but the use of this approach does not enable an optical confinement to a gain medium having a thickness which is smaller than the diffraction limit of light. Therefore, other types of optical confinement approaches have been proposed for oscillating a long wavelength laser.

Japanese Patent Application Laid-Open No. 2000-138420 discloses a method for solving the above problem. The cladding used in this method is a negative dielectric constant medium in which the real part of the dielectric constant is negative. In this method, the waveguide mode guided by the cladding is an electromagnetic wave due to the polarization oscillation of charge carriers (which is called a surface plasmon) in the negative dielectric constant medium. Since there is no diffraction limit in the surface plasmon, most of the modes can be confined to the gain medium which has a thickness on the order of $\frac{1}{10}$ of an oscillation wavelength. By using such an approach, the method achieves a laser oscillation having an oscillation wavelength of 11.4 [μm], which is shifted toward a longer wavelength.

An example of the prior art is found in Benjamin S. Williams et al.; Appl. Phys. Lett., Vol. 83 (2005), 2124. This document discloses a method for arranging negative dielectric constant media in which the real part of the dielectric constant is negative, to the top and the bottom of a gain medium as a cladding. In this method as well, the waveguide mode guided by the claddings is a surface plasmon. The gain medium having two negative dielectric constant media as a cladding allows more modes to be confined to the thin gain medium which has a thickness on the order of $\frac{1}{10}$ of an oscillation wavelength, compared to the case in Japanese Patent Application Laid-Open No. 2000-138420. By using such an approach, the method achieves a laser oscillation having an oscillation wavelength of about 100 [μm] (3 [THz]), which is shifted further toward a longer wavelength.

However, it is known that, in the conventional approaches for optical confinement, a confinement of a surface plasmon to a gain medium which is much thinner than an oscillation wavelength causes a relatively large waveguide loss. The waveguide loss increases a threshold of laser oscillation, which in turn causes other problems such as an increase of power consumption accompanied by an increased threshold current density, and a necessity of a separate cooling unit for maintaining the laser oscillation. Because the thinner gain medium increases the threshold of laser oscillation, a gain medium had to have a relatively large thickness for the conventional long wavelength laser. That is, a gain medium which is used in a quantum cascade laser and is formed with a semiconductor multi-layer film including hundreds to thousands of layers is required, but such a gain medium is relatively expensive, and has increased the cost of the conventional long wavelength laser.

The above problems are particularly acute in the case of a long wavelength laser of 100 [μm] or more (3 [THz] or less) which requires an optical confinement to a gain medium having a thickness of $\frac{1}{10}$ or less of an oscillation wavelength.

SUMMARY OF THE INVENTION

A laser device of the present invention includes a gain medium that has a gain for an electromagnetic wave to be oscillated, a waveguide for propagating the electromagnetic wave, and a resonant structure comprised of the waveguide for resonating the electromagnetic wave. The gain medium extends in the propagation direction of the electromagnetic wave, and is sandwiched, at the top and bottom surfaces in the thickness direction thereof, between a first cladding and a second cladding each of a negative dielectric constant medium with a negative real part of a dielectric constant for the electromagnetic wave. The gain medium is provided with a lateral structure adjacent to at least one of the side surfaces thereof in the width direction perpendicular to the propagation direction of the electromagnetic wave and the thickness direction. The lateral structure is configured so that a positive dielectric constant medium with a positive real part of a dielectric constant for the electromagnetic wave is sandwiched, at the top and bottom surfaces in the thickness direction thereof, between negative dielectric constant media with a negative real part of the dielectric constant for the electromagnetic wave. The waveguide is comprised of the gain medium, the lateral structure, the first cladding and the second cladding. The frequency of the electromagnetic wave typically includes a portion of the frequency range from 30 GHz to 30 THz.

A laser device of the present invention includes a first cladding, a second cladding and a lateral structure, as described above. Therefore, even when a gain medium which is much thinner than an oscillation wavelength is used, a relatively large portion of the mode intensities can be confined to the gain medium, and waveguide loss is decreased, resulting in a lower threshold for laser oscillation.

Further features of the present invention will become apparent from the following description of exemplary embodiments with reference to the attached drawings.

DESCRIPTION OF THE EMBODIMENTS

Now an embodiment of a laser device according to the present invention will be described below. An embodiment of a laser device according to the present invention includes: a gain medium that has a gain for an electromagnetic wave to be oscillated (including a portion of the frequency range from 30 GHz to 30 THz), a waveguide for propagating the electromagnetic wave, and a resonant structure comprised of the waveguide for resonating the electromagnetic wave. The gain medium extends in the propagation direction of the electromagnetic wave, and is sandwiched, at the top and bottom surfaces in the thickness direction thereof, between a first cladding and a second cladding of a negative dielectric constant medium. The gain medium is provided with a lateral structure which includes a positive dielectric constant medium, adjacent to at least one of the side surfaces thereof in the width direction perpendicular to the propagation direction of the electromagnetic wave and the thickness direction. The lateral structure is configured so that the positive dielectric constant medium is sandwiched, at the top and bottom surfaces in the thickness direction thereof, between the negative dielectric constant media. In this way, the waveguide is comprised of the gain medium, the lateral structure, the first cladding and the second cladding. Moreover, one of the first cladding and the second cladding can be provided with at least one opening, thereby a portion of a standing wave is extracted to an exterior space or an exterior transmission line.

Figure 1:
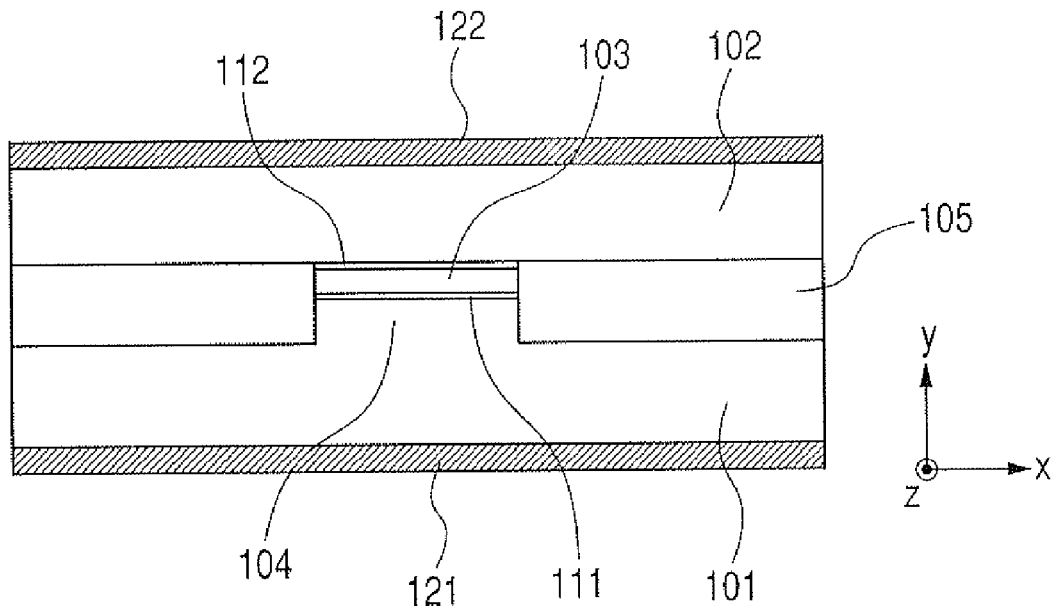
FIG. 1 is a cross sectional view illustrating an embodiment of a laser device according to the present invention.

FIG. 1 is a cross sectional view illustrating a laser device of the embodiment. In FIG. 1, the laser device includes negative dielectric constant media 101 and 102 which are substances with a real negative part of the dielectric constant for a frequency range of an electromagnetic wave to be oscillated. The negative dielectric constant media are composed of a material including a carrier-doped semiconductor (for example, InAs, InP, GaAs and Si), a metal (for example, Ag, Au, Cu and Al), or a combination of these materials, within a frequency range from a millimeter wave band to a terahertz wave band. The negative dielectric constant medium is also typically a conductive material, and so may be a transparent conductive film (e.g. ITO). Within a frequency range from a millimeter wave band to a terahertz wave band, a metal which has a relatively large ratio Im($\epsilon$)/Re($\epsilon$) of an imaginary part to a real part of dielectric constant (where $\epsilon$ is a complex dielectric constant), compared to that of other materials, can most reduce conductor loss. Therefore, the negative dielectric constant media 101 and 102 can be comprised of a metal.

As shown in FIG. 1, the laser device includes a gain medium 103 sandwiched, at the top and bottom surfaces thereof, between the negative dielectric constant media 101 and 102. The gain medium is generally a material which produces a gain upon a carrier injection, and in order to achieve the current injection from an external device, the gain medium 103 needs to be in electrical contact with the negative dielectric constant media 101 and 102. So, high concentration carrier-doped semiconductors are used as electrical contacts 111 and 112. The term "high concentration" as used herein means a concentration higher than that at which at least the real part of dielectric constant is negative. Moreover, the laser device includes electrode materials 121 and 122. An electric field supplied by an exterior electric field applying unit (not shown) is applied between the electrode materials 121 and 122 to conduct current injection to the gain medium 103.

In the above structure, the negative dielectric constant media 101 and 102 and the electrical contacts 111 and 112 function as a cladding in a millimeter wave band and a terahertz band. Thus, for an electromagnetic wave guided by the negative dielectric constant media 101 and 102 and the electrical contacts 111 and 112, a surface plasmon without diffraction limit is allowed as a waveguide mode. This allows a waveguide mode to exist even if the gain medium 103 has a thickness (a dimension in the y direction) which is much smaller compared to the wavelength. Herein, the much smaller dimension compared to the wavelength means a thickness of one tenth or less of the wavelength of an electromagnetic wave, in view of the description in the above Description of the Related Art.

However, in the above situation, the surface plasmon is severely affected by conductor loss in the negative dielectric constant media 101 and 102 or the electrical contacts 111 and 112. This inevitably causes a relatively large waveguide loss. Therefore in the present invention, the waveguide loss is reduced as follows. That is, the amount of the waveguide loss is approximately proportional to the product of a wavenumber of a waveguide mode in the propagation direction and a loss due to the used material. The loss due to the used material includes the conductor loss of the negative dielectric constant media 101 and 102 and the electrical contacts 111 and 112.

However, taking the wavenumber of a waveguide mode in the propagation direction as "$\beta$", actually it is possible to decrease the wavenumber $\beta$. To decrease the wavenumber $\beta$, a coupled waveguide mode may be formed by coupling with a surface plasmon having a smaller wavenumber. The wavenumber $\beta$ is proportional to the equivalent refractive index of the waveguide mode. Thus, the reduction of the wavenumber $\beta$ corresponds to a lateral expansion of the waveguide mode in the real space. This is the reason for providing the lateral structure in which the positive dielectric constant medium 105 is sandwiched, at its top and bottom surfaces, between the negative dielectric constant media 101 and 102. Typically, when the positive dielectric constant medium 105 has a thickness larger than that of the gain medium 103, the wavenumber of the surface plasmon held by the positive dielectric constant medium 105 is smaller than that of the surface plasmon held by the gain medium 103. So, in this embodiment, at least one of the negative dielectric constant media 101 and 102 includes a rib 104 which projects toward the gain medium across the entire width of the gain medium 103. As a rib structure which includes the rib 104 and the gain medium 103 and extends in the propagation direction, the first and second claddings and the lateral structure are formed. In FIG. 1, the rib 104 projecting toward the gain medium is formed only on the lower side of the gain medium 103.

Figure 9A:
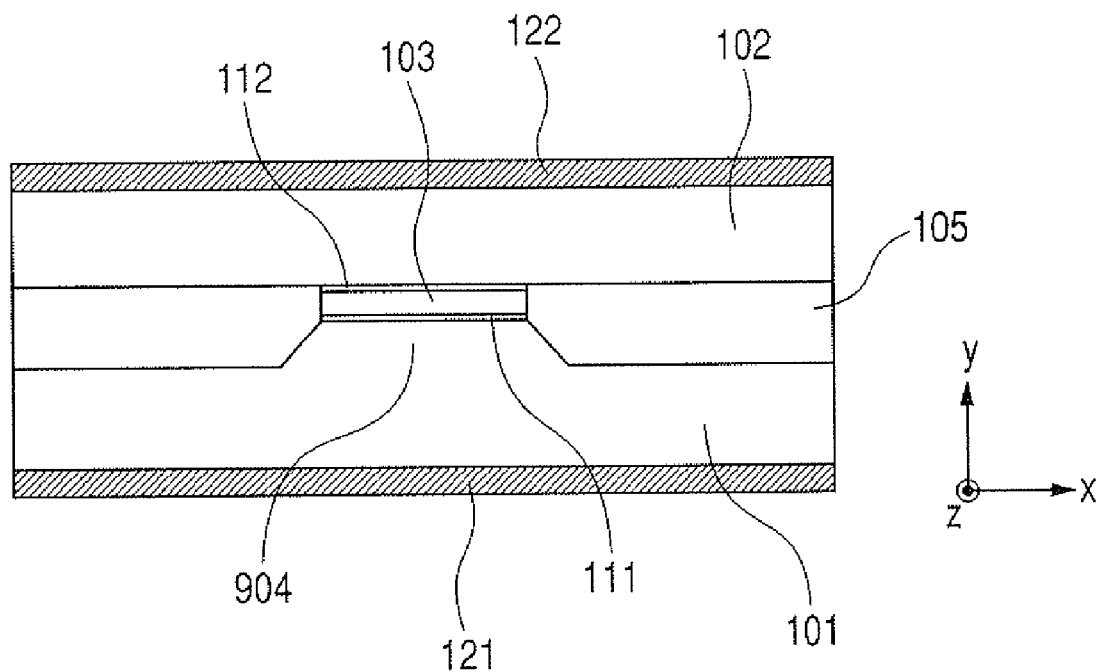
FIGS. 9A and 9B are cross sectional views illustrating a modified embodiment of the present invention.
Figure 9B:
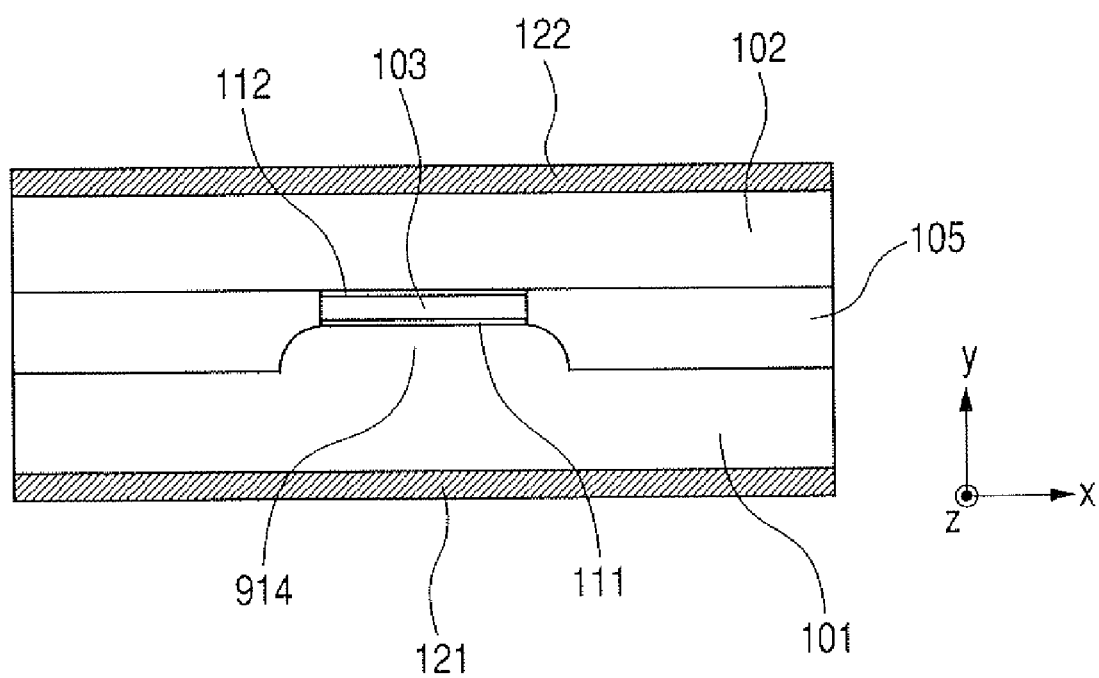
Figure 10:
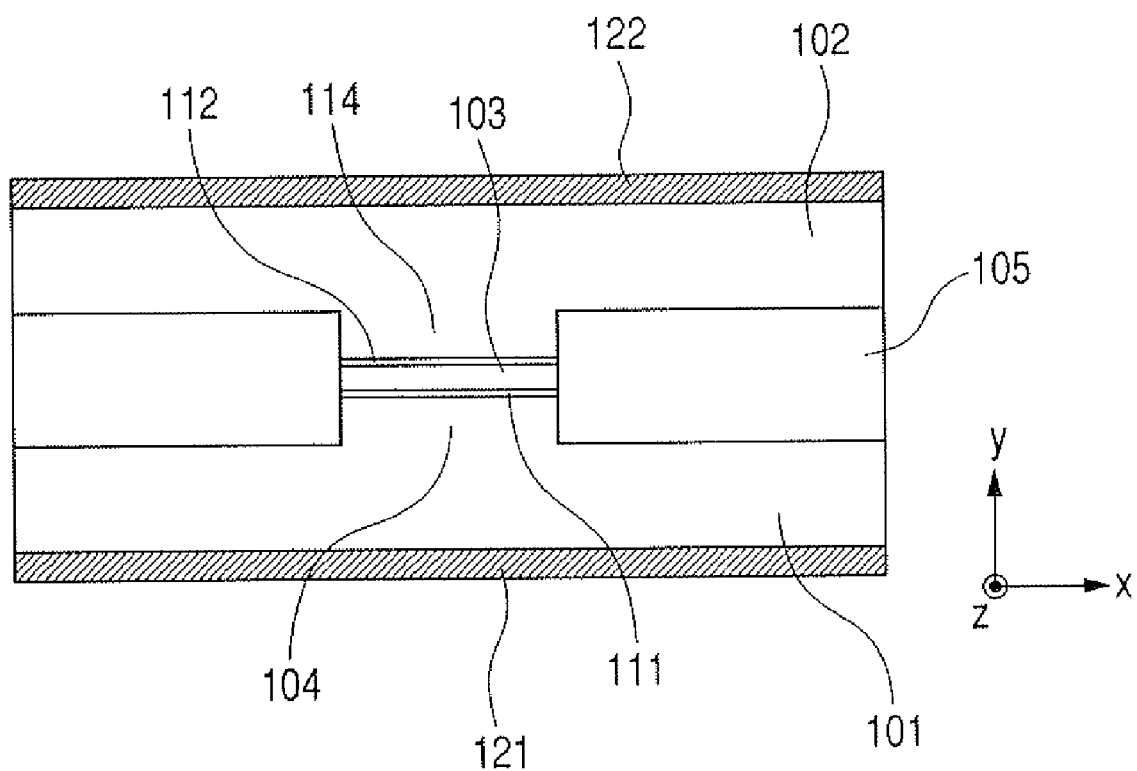
FIG. 10 is a cross sectional view illustrating another modified embodiment of the present invention.

The rib 104 has a strip shape in FIG. 1, but the rib may have other shapes like a rib 904 having a trapezoidal shape in FIG. 9A, or a rib 914 having a semicylindrical shape in FIG. 9B. Alternatively, ribs 104 and 114 may be provided as shown in FIG. 10. That is, both of the negative dielectric constant media 101 and 102 are provided with the ribs 104 and 114 which project toward the gain medium across the entire width of the gain medium 103, respectively.

However, in order to more sufficiently achieve the above-mentioned coupling, the rib 104 can have a width (a dimension in the x direction) which is equal to or less than the wavelength. Also, the positive dielectric constant medium 105 can have a width (a dimension in the x direction) which is at least equal to or more than the thickness of the gain medium 103. When designed more appropriately, the beam waist of the waveguide mode can be extended to be equal to or more than the width of the rib 104. In this way, while the mode intensities are confined to the gain medium 103, the wavenumber $\beta$ can be further reduced, which is effective in reducing the waveguide loss and lowering the threshold for laser oscillation.

The above effects are particularly evident when the gain medium 103 has a thickness which is much smaller compared to the wavelength. Therefore, the use of a resonant tunneling diode for the gain medium 103 can suppress the waveguide loss to the degree comparable to that obtained by use of a conventional medium. The gain of the resonant tunneling diode is roughly equal to or approximately one order of magnitude higher than that obtained by a quantum cascade laser (several tens $cm^{-1}$), and moreover the reduction of the gain due to a temperature rise is small, which is expected to achieve a laser oscillation at room temperature. Thus, the above structure seems to be effective within a frequency range from a millimeter wave band to a terahertz wave band, including the frequency range of 0.1 [THz] to 10 [THz].

An electromagnetic field simulation was performed to confirm the above described effect. An approach according to a wavenumber space plane wave expansion method (see Phys. Rev. B, Vol. 68, 245117 (2003)) was used which is a frequency solver for calculating the complex propagation constant $\gamma$ ($=\beta+i\alpha$, where i is an imaginary unit, $\alpha$ is a damping constant) of a waveguide mode. A material having a negative dielectric constant was specified by using the complex dielectric constant model given by Drude as well known by those skilled in the art. The simulation was performed on the assumption that a simulation wavelength range of 900 [μm] to 300 [μm] (corresponding to the frequency range of 0.3 [THz] to 1 [THz]), which is considered to provide a large gain in a resonant tunneling diode, was used, and that the negative dielectric constant media 101 and 102 were formed of Au. The electron relaxation time $\tau$ was set to be 0.05 [psec] as in the case described in Benjamin S. Williams et al.; Appl. Phys. Lett., Vol. 83 (2005), 2124. Within the frequency range of 0.3 [THz] to 1 [THz], the real part of the dielectric constant of Au is negative. The electrical contacts 121 and 122 had a thickness of 50 [nm] and 100 [nm] respectively, and, on the assumption of a use of an InGaAs semiconductor material system, the electron relaxation time $\tau$ was set to be 0.1 [psec] as in the above case. Also, the simulation was performed on the assumption that the gain medium 103 was a semiconductor multiple-quantum well (resonant tunneling diode) formed of an i-InGaAs material system and that the thickness of the well was 30 [nm]. Within the frequency range of 0.3 [THz] to 1 [THz], the real part of the dielectric constant of i-InGaAs is positive, which is an asymptotic value to a background dielectric constant $\epsilon=11.6$.

Figure 2:
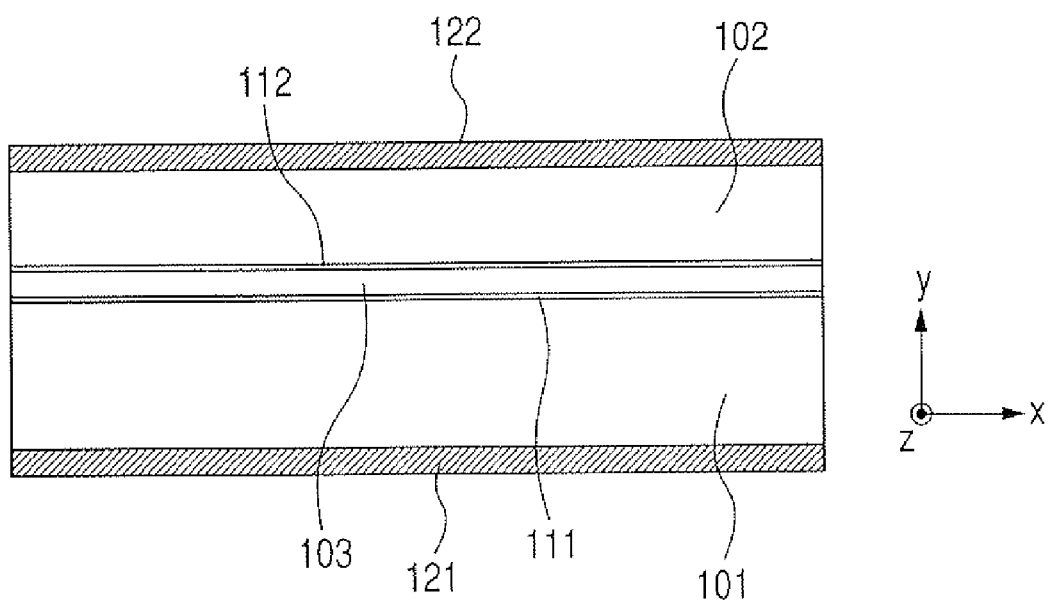
FIG. 2 is a cross sectional view illustrating a conventional laser device as a comparative example.

The structure used in the simulation had an x-y cross section as shown in FIG. 1 and FIG. 2, and the propagation direction z of the waveguide mode was assumed to be infinite. FIG. 1 illustrates a cross section of the embodiment, while FIG. 2 illustrates a cross section of a conventional device. Furthermore, in the cross section of the embodiment of FIG. 1, the rib 104 was set to have a width of 4 [μm], and the positive dielectric constant medium ($\epsilon=1$) 105 was set to have a thickness of 1 [μm]. In the simulation, the dimensions in the x and y directions were 3 [μm] and 90 [μm] respectively, and on both directions periodic boundary conditions were imposed. The number of basis of plane wave expansion was set to be 17 in the x direction and 61 in the y direction.

Figure 3A:
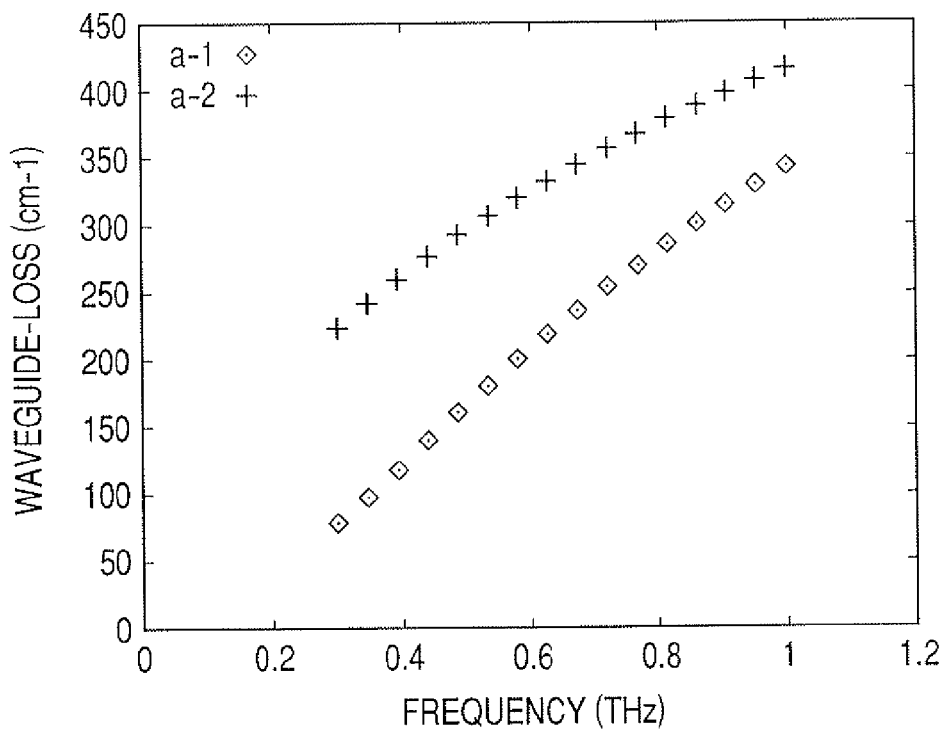
FIGS. 3A and 3B are views comparing a waveguide loss of an embodiment according to the present invention with that of a conventional example.

Now, the result of the simulation will be described below. FIG. 3A illustrates a relationship between waveguide loss (twice the value $\alpha$ as a power loss) and frequency. The legends (a-1) and (a-2) in FIG. 3A correspond to the following conditions respectively.

(a-1)

In the structure of the embodiment, the waveguide loss at a frequency of 0.3 [THz] was estimated to be 79 [$cm^{-1}$]. The loss was calculated based on the conductor loss of the negative dielectric constant media 101 and 102 (including the electrical contacts 111 and 112). The beam waist of the waveguide mode (in the x direction) was about 8 [μm]. At this point, the confinement of the mode intensities was estimated to be at least 40% or more.

(a-2)

In the structure of a conventional device, the waveguide loss at a frequency of 0.3 [THz] was estimated to be 224 [$cm^{-1}$]. Similarly, the loss was calculated based on the conductor loss of the negative dielectric constant media 101 and 102 (including the electrical contacts 111 and 112).

Figure 3B:
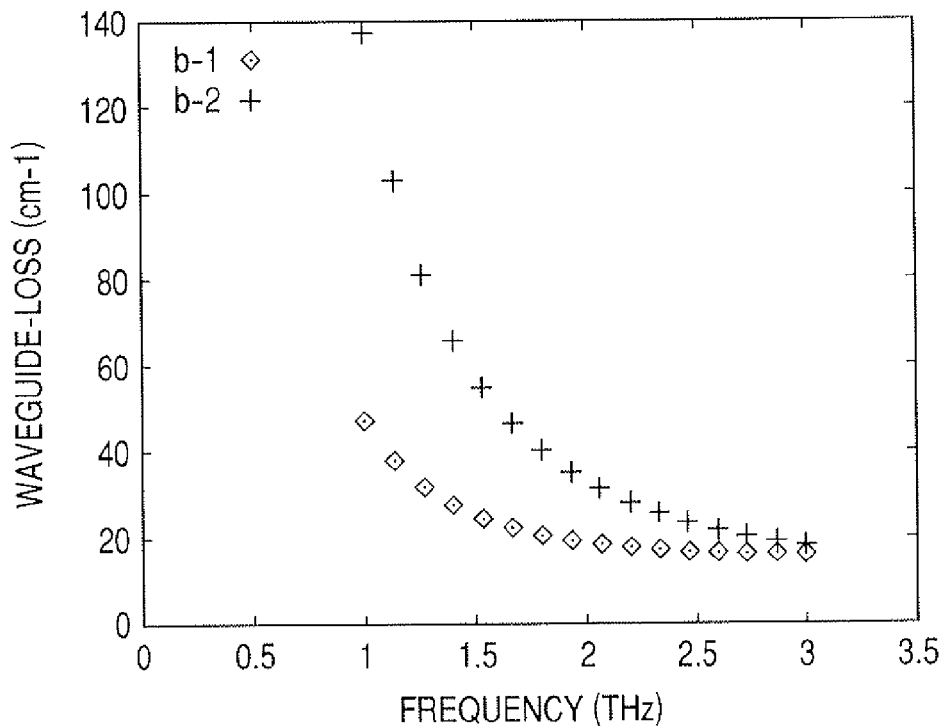

The frequency dependence of FIGS. 3A and 3B shows that the waveguide loss in the structure of the embodiment was reduced across the entire frequency range of 0.3 [THz] to 1 [THz], which means that the structure of the embodiment is effective.

Figure 4A:
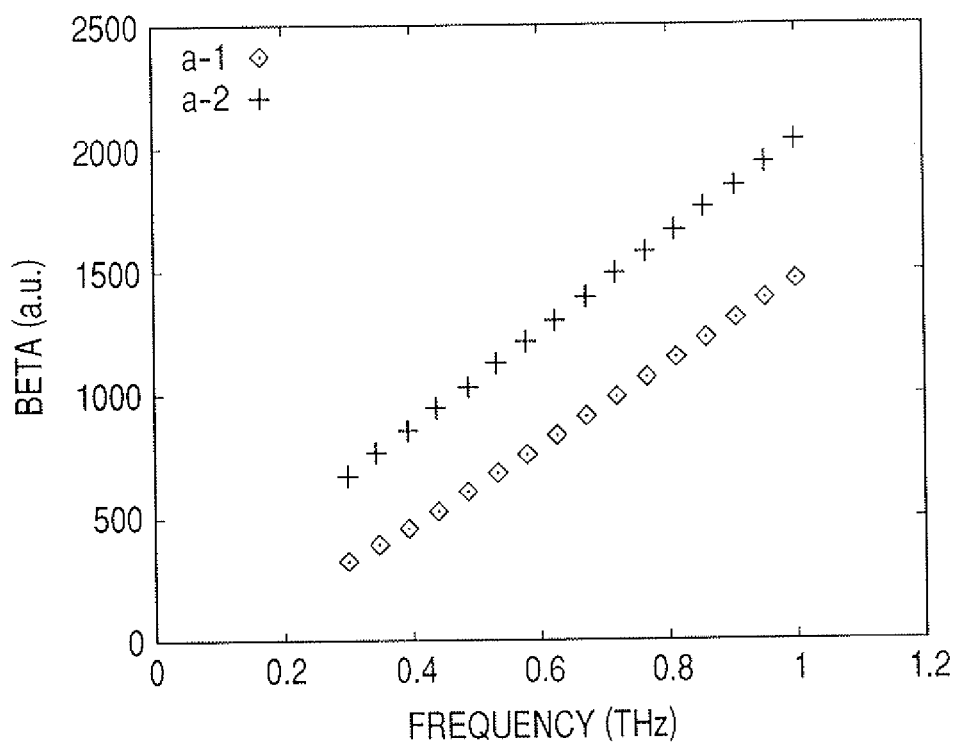
FIGS. 4A and 4B are views comparing a wavenumber in an embodiment according to the present invention with that of a conventional example.

FIG. 4A illustrates a relationship between the wavenumber $\beta$ and frequency, and supports the above described reason for the achievement of the waveguide loss reduction. The waveguide loss tends to increase at a higher frequency, which coincides with the tendency of the conductor loss which increases at a higher frequency.

Next, an electromagnetic filed simulation was performed in the same way by using a gain medium 103 having a thickness of approximately 1/10 of a wavelength as in the case with a conventional device in order to confirm that the same effect is obtained. The simulation was performed on the assumption that a simulation wavelength range of 300 [μm] to 100 [μm] (corresponding to the frequency range of 1 [THz] to 3 [THz]), which is considered to provide a large gain in a quantum cascade laser, was used, and that the negative dielectric constant media 101 and 102 were formed of Au. The electron relaxation time $\tau$ was set to be 0.05 [psec] as in the case described in Benjamin S. Williams et al.; Appl. Phys. Lett., Vol. 83 (2005), 2124. The electrical contacts 121 and 122 had a thickness of 50 [nm] and 100 [nm] respectively, and, on the assumption of a use of an GaAs material system, the electron relaxation time $\tau$ was set to be 0.1 [psec] as in the above cases. Also, the simulation was performed on the assumption that the gain medium 103 was a semiconductor multiple-quantum well (quantum cascade laser) formed of a slightly carrier-doped n-GaAs material system and that the thickness of the well was 10 [μm]. Within the frequency range of 1 [THz] to 3 [THz], the real part of the dielectric constant of n-GaAs is positive, which is an asymptotic value to a background dielectric constant ε=12.9. Then, the free electron relaxation time τ was set to be 0.1 [psec].

The structure used in the simulation had an x-y cross section as shown in FIG. 1 and FIG. 2, and the propagation direction z of the waveguide mode was assumed to be infinite. In the cross section of the embodiment of FIG. 1, the rib 104 was set to have a width of 4 [μm], and the positive dielectric constant medium (ε=1) 105 was set to have a thickness of 20 [μm]. In the simulation, the dimensions in the x and y directions were 30 [μm] and 20 [μm] respectively, and on both directions periodic boundary conditions were imposed. The number of basis of plane wave expansion was set to be 17 in the x direction and 21 in the y direction.

The result of the simulation will be described below. FIG. 3B illustrates a relationship between waveguide loss (twice the value α as a power loss) and frequency. The legends (b-1) and (b-2) in FIG. 3B correspond to the following conditions respectively.

(b-1)

In the structure of the embodiment, the waveguide loss at a frequency of 3 [THz] was 17 [cm$^{-1}$]. The loss was further analyzed, which led to a consideration that the amount of about 9.6 [cm$^{-1}$] in the waveguide loss is based on the conductor loss of the negative dielectric constant media 101 and 102 (including the electrical contacts 111 and 112), and the other loss is the free electron absorption loss in the gain medium 103. The beam waist of the waveguide mode was about 9 [μm].

(b-2)

In the structure of a conventional device, the waveguide loss at a frequency of 3 [THz] was estimated to be 19 [cm$^{-1}$]. The amount of about 6.0 [cm$^{-1}$] in the waveguide loss is considered to be based on the conductor loss of the negative dielectric constant media 101 and 102 (including the electrical contacts 111 and 112), and the other loss is considered to be the free electron absorption loss in the gain medium 103. This result almost coincides with the tendency of waveguide loss in the prior art as described in Benjamin S. Williams et al.; Appl. Phys. Lett., Vol. 83 (2005), 2124.

The frequency dependence of FIG. 3B shows the reduction of the waveguide loss at around the frequency range of 1 [THz] to 2 [THz], which means that the structure of the embodiment is effective.

Figure 4B:
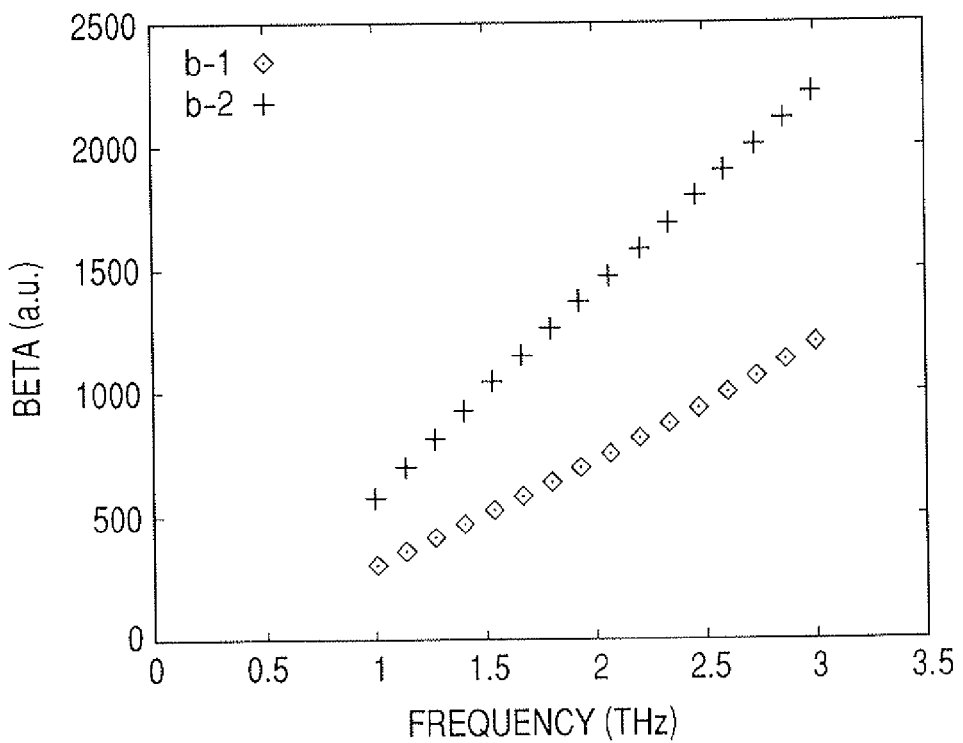

FIG. 4B illustrates a relationship between the wavenumber β and frequency, and supports the above described reason for the achievement of the waveguide loss reduction. However, at around the frequency of 3 [THz], the waveguide loss is saturated, and rather the conductor loss increases which is considered to be caused by the corners of the strip rib 104. This increase is due to the selection of the shape of the rib 104, and is not essential in the present invention. For, as described above already, the rib 104 may have a trapezoidal or semicylindrical shape to eliminate the corners. The waveguide loss tends to decrease at a higher frequency, which coincides with the tendency of the free electron absorption loss which increases at a lower frequency.

However, in the above embodiments of the present invention, if the gain medium 103 has a gain that extends to a frequency range lower than the millimeter wave band, parasitic RF oscillation may be generated. This can be prevented as follows. That is, the parasitic RF oscillation is caused by RC time constant. For example, the time constant in a RC resonance circuit from the gain medium 103 to an exterior electric field applying unit (not shown) via the electrode material 121 and 122 also causes the parasitic RF oscillation. So, a method for supplying an electric field between the electrode materials 121 and 122 via a bias T and a method for inserting a separate resistor between the electrode materials 121 and 122 are known to solve the above problem in the analog circuit technology, and these elements may be added.

According to the above described structure of a laser device, even if a gain medium having a thickness much smaller than an oscillation wavelength is used, most of the mode intensities can be confined to the gain medium, which reduces waveguide loss, resulting in a lower threshold for laser oscillation. Moreover, the reduced threshold current density leads to a reduction of power consumption, as well as a simplification or elimination of a cooling unit for maintaining a laser oscillation. As a gain medium, a resonant tunneling diode may be used which is available at a relatively low cost.

EXAMPLE

Now, the present invention will be described in detail by way of more specified examples.

Example 1

Figure 5A:
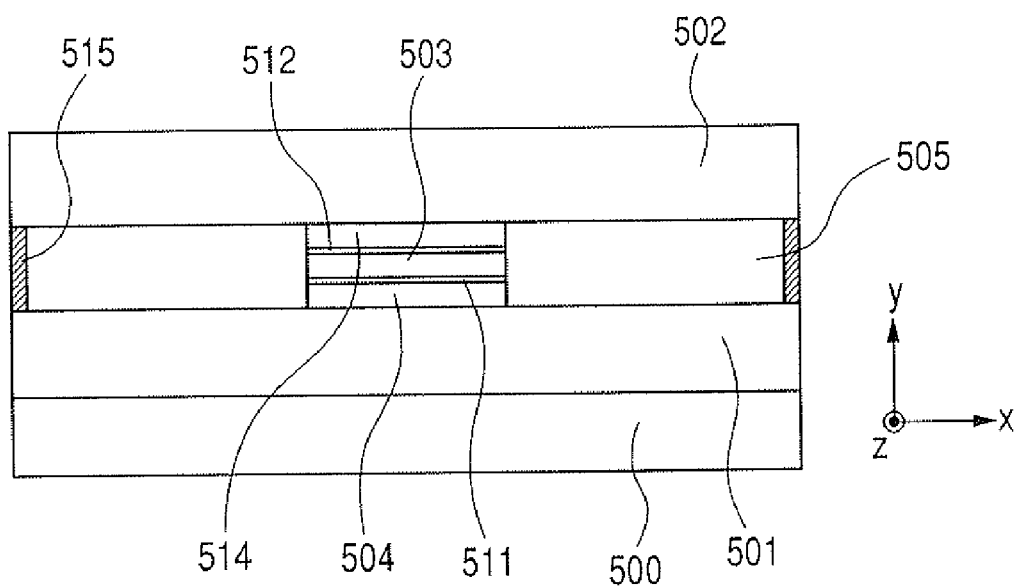
FIGS. 5A and 5B are cross sectional views illustrating a structure of a laser device according to Example 1.
Figure 5B:
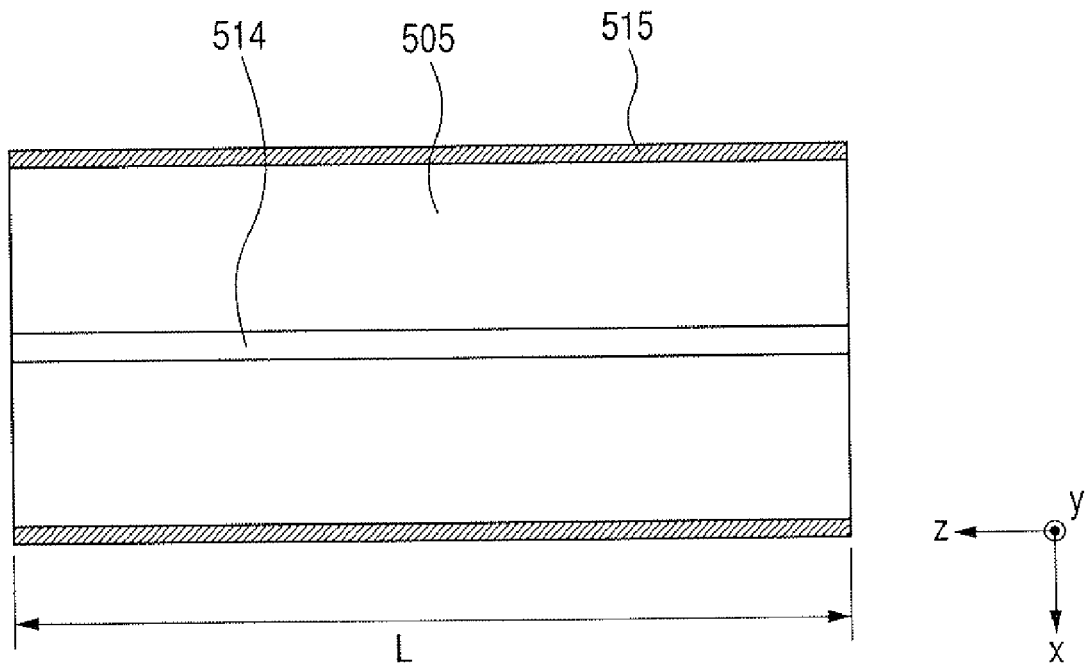

FIGS. 5A and 5B are cross sectional views illustrating Example 1 of a laser device according to the present invention. Example 1 is a laser device made through a metal compression process.

FIG. 5A is a cross sectional view illustrating a surface perpendicular to the propagation direction of an electromagnetic wave. In FIG. 5A, a negative dielectric constant medium 501 is an Au thin film which is deposited on a Si substrate 500 for reducing conductor loss. A negative dielectric constant medium 502 is made of Au. Between the negative dielectric constant medium 501 and the negative dielectric constant medium 502 is provided a rib structure, which includes ribs 504 and 514 extending along the propagation direction of the electromagnetic wave and a gain medium 503. The rib 514 functions as the electrode material that includes Au formed on the negative dielectric constant medium 502, and is formed by bonding with the Au 502. Similarly, the rib 504 functions as the electrode material that includes Au formed on the negative dielectric constant medium 501, and is formed by bonding with the Au thin film 501.

In Example 1, a multiple-quantum well of an InGaAs/InAlAs system which is lattice matched to an InP substrate is selected as the gain medium 503. For example, a resonant tunneling diode having the following semiconductor multilayer film structure may be selected.

5.0/3.8/5.6/2.7/7.7/3.8/5.0

(where each number is a thickness of each section in [nm]: the numbers without underline are for the wells of InGaAs; and the underlined numbers are for potential barriers of InAlAs)

When each layer is intended not to be carrier-doped (i.e. undoped), the free electron absorption loss at the gain medium 503 is negligible.

This resonant tunneling diode has a gain within a frequency range from a millimeter wave band to a terahertz wave band, based on a phenomenon called photon-assisted tunneling. The above resonant tunneling diode was a negative resistive element having a peak current density of about 50 k [A/cm$^2$] upon an application of an electric field of 0.3 [V]. Therefore, the resonant tunneling diode is considered to have a gain of about 130 [cm$^{-1}$] within a frequency range of 0.3 [THz] to 1 [THz] (see Jpn. Jour. Appl. Phys., Vol. 40, 5251 (2001)).

In the negative dielectric constant medium 501, the electrical contact 511 in contact with the gain medium 503 is comprised of a semiconductor film of n-InGaAs (thickness 100 [nm]), for example. Similarly, in the negative dielectric constant medium 502, the electrical contact 512 in contact with the gain medium 503 is comprised of a semiconductor film of n-InGaAs (thickness 50 [nm]), for example. In this case also, in order to reduce conductor loss, the electrical contacts 511 and 512 can be high concentration carrier-doped layers which have an electron concentration of $1 \times 10^{18}$ cm $[cm^{-3}]$ or more for example. The gain medium 503 and the electrical contacts 511 and 512 are formed by epitaxially growing a semiconductor layer on an InP substrate, but in FIG. 5A, the InP substrate is already removed. A current injection is performed via the Au media 501 and 502, and the Au media 501 and 502 are connected to a constant voltage source (not shown) via an electric cable for example. In this way, the electrode materials are arranged so that an electric field can be properly applied therebetween.

In Example 1, the positive dielectric constant media 505, which form lateral structures adjacent to the side of the rib structure, are air, and other positive dielectric constant media 515 are used to provide spaces to be filled with the air. For example, the positive dielectric constant media 515 may be BCB which is a material with a relatively low loss and a low dielectric constant.

In FIG. 5A, the Au media 501 and 502 have a thickness larger than the skin depth of electromagnetic wave within a range from a millimeter wave band to a terahertz wave band. For example, the thickness is set to be 300 [nm] or more. The ribs 504 and 514 in Example 1 each have a width of 4 [μm], and the positive dielectric constant media 505 and 515 each have a thickness of 1 [μm].

In Example 1, the laser resonator is a Fabry-Perot resonator having end surfaces which are formed by cutting. That is, the waveguide has at least two end surfaces in the propagation direction of the electromagnetic wave to form a resonant structure, so that the end surfaces are used to reflect the electromagnetic wave to create a standing wave. Therefore, as shown in FIG. 5B (which is a cross sectional view illustrating an x-z plane including the rib 514 of FIG. 5A), a length L in the propagation direction is the factor which determines an oscillation wavelength. Now, when a surface plasmon waveguide mode at a frequency to be oscillated has a wavenumber β, as well known in the semiconductor laser technology, the value π/β is set to be an integer multiple of the length L. For example, the oscillation wavelength is set to be 0.3 [THz] so that the gain of the resonant tunneling diode which is the gain medium 503 is larger than the waveguide loss. In this case, since the value π/β is found to be 0.01 [cm], for example, the length L in the propagation direction can be 0.1 [cm] which is obtained by multiplying the value π/β by ten, to achieve a laser oscillation.

The above described structure can be made by using the following method. First, an n-InGaAs layer 512, an InGaAs/InAlAs multiple-quantum well layer 503, and an n-InGaAs layer 511 are epitaxially grown on an InP substrate, by using Molecular Beam Epitaxy (MBE) for example. On the surface thereof Ti/Au 504 is deposited as an electrode, followed by etching to the substrate to form a rib having a width of 4 [μm] as described above. The etching is performed using photolithography and a dry etching with ICP (inductively coupled plasma). Next, the electrode 504 and the Au thin film 501 on the Si substrate 500 are bonded to each other by compression. Subsequently a wet etching is performed by using hydrochloric acid, which selectively removes the InP substrate, and the epitaxially grown layer in the form of rib is transferred to the Si substrate 500. Finally, using a lift-off method a rib-shaped metal film 514 is formed on a surface of the n-InGaAs layer 512 which is exposed by the removal of the InP substrate. Furthermore, an Al plate 502 having an Au coating on the surface thereof is brought in contact with the metal film 514 and into a condition of being supported by BCB 515 to form an air gap 505, which completes the above described structure.

When filling the air gap 505 with a dielectric anisotropic liquid crystal (in which the liquid crystal molecule has different dielectric constants in the long axis and the short axis thereof) as a positive dielectric constant medium 505, application of an electric field for controlling the liquid crystal molecules can change the wavenumber β of the waveguide mode. For such a frequency tunable laser, for example, the length L in the propagation direction is so arranged to be 100 times as long as the value π/β in advance so as to use a number of resonant frequencies.

Example 2

Figure 6A:
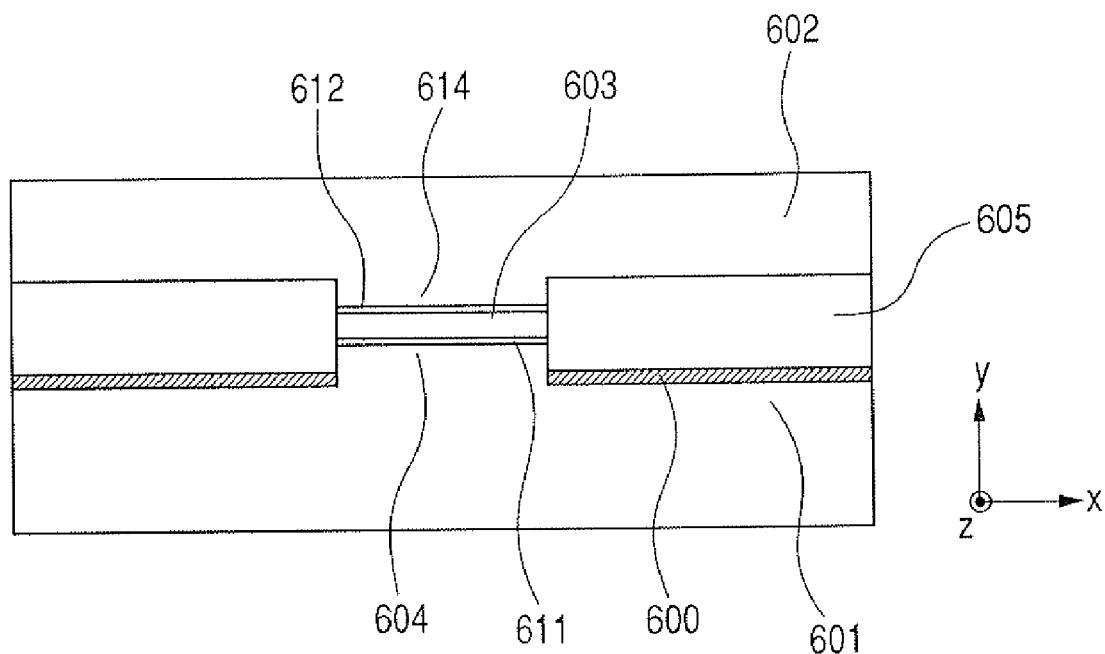
FIGS. 6A and 6B are cross sectional views illustrating a structure of a laser device according to Example 2.
Figure 6B:
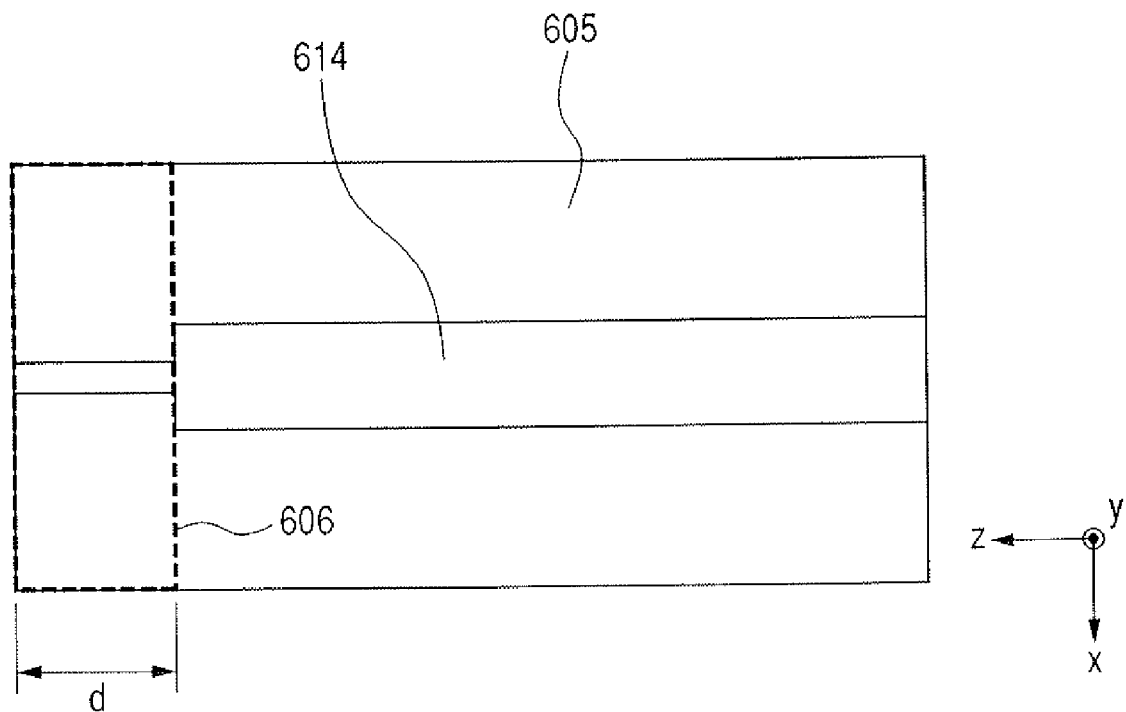

FIGS. 6A and 6B are cross sectional views illustrating Example 2 of a laser device according to the present invention. Example 2 is a laser device according to the present invention which can be manufactured in a simple manner.

FIG. 6A is a cross sectional view illustrating a surface perpendicular to a propagation direction of an electromagnetic wave. In FIG. 6A, a negative dielectric constant medium 601 is an n-InP substrate. For reduction of conductor loss, a high concentration carrier-doped conductive substrate which has an electron concentration of $1 \times 10^{19}$ cm $[cm^{-3}]$ or more for example can be selected. Alternatively, a high concentration carrier-doped thick substrate of n-InGaAs may be selected. In Example 2, an Au thin film 600 is formed to reduce conductor loss in the n-InP substrate 601. A negative dielectric constant medium 602 is made of Au. A rib structure of Example 2 includes ribs 604 and 614 and a gain medium 603. The rib 614 is formed integrally with the Au medium 602 by deposition, and the rib 604 is formed by etching the n-InP substrate 601. In Example 2 also, a multiple-quantum well of an InGaAs/InAlAs system which is lattice matched to the InP substrate is selected as the gain medium 603 to obtain the same structure as that of Example 1 for example.

An electrical contact 611 on the gain medium 603 side is comprised of an n-InGaAs semiconductor layer (thickness 400 [nm]) for example. Similarly, an electrical contact 612 on the gain medium 603 side is comprised of an n-InGaAs semiconductor layer (thickness 50 [nm]) for example. As in Example 1, in order to reduce conductor loss, the electrical contacts 611 and 612 can be high concentration carrier-doped layers which have an electron concentration of $1 \times 10^{18}$ cm $[cm^{-3}]$ or more for example. The Au 600 and 602 also function as electrode materials, thereby a current injection is performed via the Au 600 and 602 which are connected to a constant voltage source (not shown) via an electric cable etc. In this way, the electrode materials are arranged so that an electric field can be properly applied therebetween. A positive dielectric constant medium 605 is provided adjacent to a side of the gain medium 603, and BCB which has a relatively low loss and a low dielectric constant can be used for the positive dielectric constant media 605.

In FIG. 6A, the n-InP substrate 601 is a substrate which has a typical thickness of 350 [μm] for example, with even the smallest thickness being larger than the skin depth of an electromagnetic wave within a range from a millimeter wave band to a terahertz wave band. In order to reduce conductor loss of the n-InP substrate 601, the Au thin film 600 is also arranged to have a thickness larger than the skin depth of the electromagnetic wave, which is for example 300 [nm]. The ribs 604 and 614 have a width of 8 [µm] to facilitate the manufacturing, and the BCB 605 is set to have a thickness of 3 [µm]. Alternatively, other more suitable combinations of thicknesses may be selected.

In Example 2 also, the laser resonator to use is a Fabry-Perot resonator having end surfaces of the waveguide which are formed by cutting. However, particularly when the laser should be output from one of the end surfaces, as shown in FIG. 6B (which is a cross sectional view illustrating an x-z plane including the rib 614 of FIG. 6A), an impedance transformation structure 606 which enhances coupling efficiency with the external space may be provided to lower the reflectance. To achieve this, a λ/4 impedance converter which is well known in the microwave technology is employed for example. That is, the impedance transformation structure 606 is so configured as to have a width d which is equal to the value $\pi/2\beta$ of the converter, so that the ribs 604 and 614 have a width which is shorter by the length d from the end surfaces thereof to reduce impedance mismatch with the external space. This may be applied to the case where the coupling efficiency with an external high frequency transmission path such as a microstripline and a coplanar waveguide should be enhanced. To the contrary, the ribs 604 and 614 may have a width which is longer by the length d from the end surfaces thereof to create greater impedance mismatch with the external space.

The above described structure may be made by using the following method for example. That is, as in Example 1, an n-InGaAs layer 611, an InGaAs/InAlAs multiple-quantum well layer 603, and an n-InGaAs layer 612 are epitaxially grown on an n-InP substrate 601 by using MBE. Then etching is conducted to the InP substrate 601 to form ribs having a width of 8 [µm] as in Example 1, so that a Cr/Au electrode 600 can be formed only on the n-InP substrate 601 by the lift-off method. Furthermore, a coat of a BCB film 605 is applied to the outside of the ribs to have a thickness of 3 [µm], and a window is formed only at a region to become the ribs using photolithography and dry etching which uses $CF_4$ and $O_2$ to expose the n-InGaAs layer 612. Onto the exposed n-InGaAs layer 612, Ti/Au is deposited to form an electrode 602, which completes the device. When an impedance transformation structure 606 of FIG. 6B is formed, the planar structure of the rib structure may be covered with a photomask.

Example 3

Figure 7A:
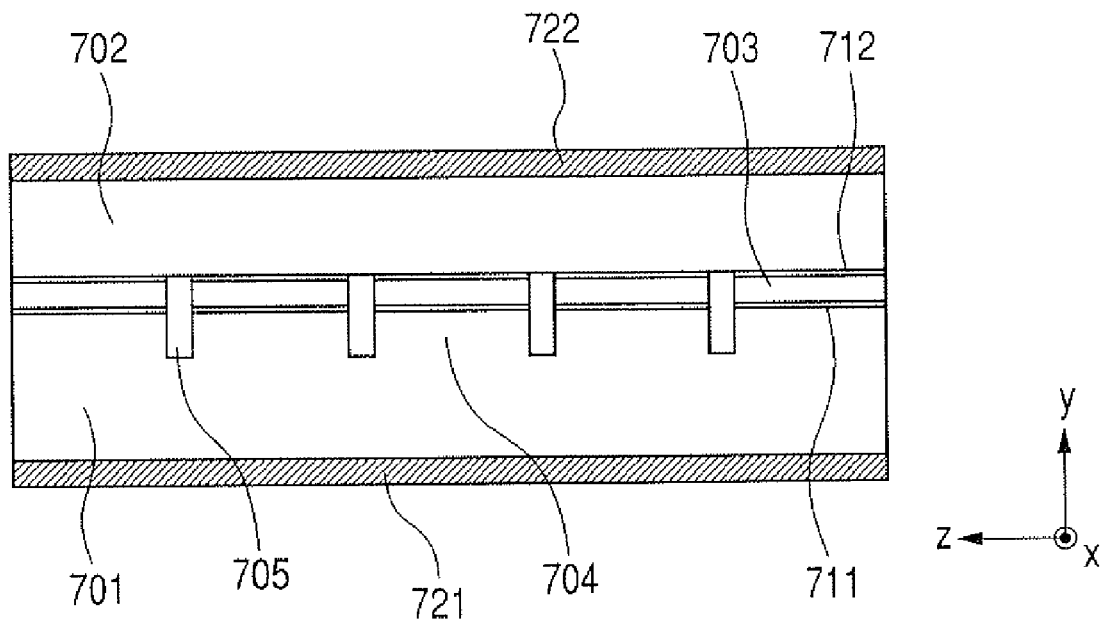
FIGS. 7A and 7B are cross sectional views illustrating a structure of a laser device according to Example 3.
Figure 7B:
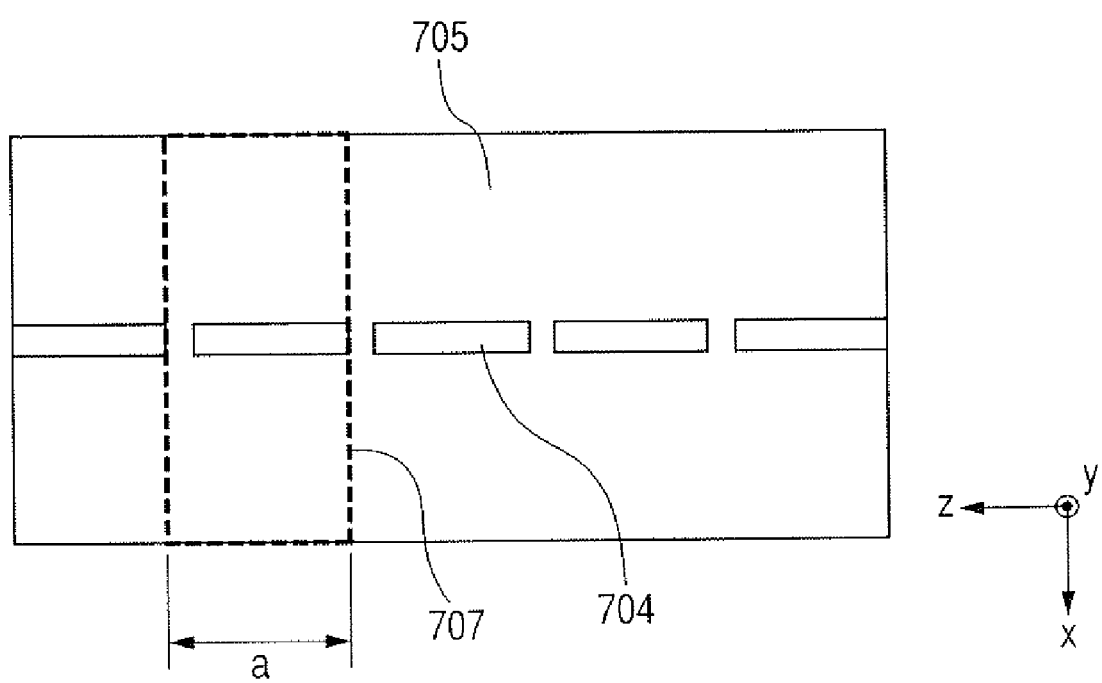

FIGS. 7A and 7B are cross sectional views illustrating Example 3 of a laser device according to the present invention. Example 3 is a laser device having a distributed feedback (DFB) resonator instead of the laser resonator in the above embodiments of the present invention. According to this laser device, the oscillation wavelength can be stabilized particularly during a high speed modulation using Examples 1 and 2 for example.

FIG. 7A is a cross sectional view of a y-z plane which includes ribs of FIG. 1, and the rib 704 has a width which periodically changes along the propagation direction. Thus, at least one of a first cladding and a second cladding is provided with a section having a dimension in a width direction which periodically changes along the propagation direction, so that the Bragg reflection is used to change an electromagnetic wave into a standing wave. Then, there is an associated change in a gain medium 703 and electrical contacts 711 and 712 in the same manner. The shape which periodically changes in Example 3 is such a rectangular as to change with or without the width (as shown in FIG. 7B, the region where the rectangular has no width can be replaced with a positive dielectric constant medium 705). Needless to say, such a sine wave shape that the width of the rib 704 changes sinusoidally may be selected. Such a structure can be considered as a hybrid type of a gain guided DFB laser and a refractive index guided DFB laser which is well known in the semiconductor laser technology. In FIG. 7A, the sections 701, 702, 721, and 722 correspond to the negative dielectric constant medium 101, the negative dielectric constant medium 102, the electrode material 121, and the electrode material 122 of FIG. 1, respectively.

In Example 3, the laser device has a basic structure which is similar to that of Example 1 (FIGS. 5A and 5B) for example, and a length of a region having the width of the rib 704 relative to one cycle length is set to 95% in terms of duty for example. In the basic structure, if the gain of the gain medium 703 is much larger than the waveguide loss, a smaller duty may be selected. At this point, as shown in FIG. 7B (which is a cross sectional view illustrating an x-z plane including the rib 704 of FIG. 7A), the length 'a' of one cycle 707 is the factor which determines the oscillation wavelength. Now, when a surface plasmon waveguide mode at a wavelength to be oscillated has a wavenumber β, the value $\pi/\beta$ may be set to be equal to the length 'a'. For example, with an oscillation wavelength of 0.3 [THz], the value $\pi/\beta$ will be approximately 0.01 [cm]. In Example 3, the cycle 707 is repeated ten times, and the end surfaces can be provided at more appropriate positions.

As described above, in the laser device including the rib 704 which has a width that periodically changes along the propagation direction, an oscillation wavelength can be stabilized. However, the structure to stabilize oscillation wavelength is not limited to that described above. For example, the rib 704 may have a fixed width, and the positive dielectric constant medium 705 may have a dielectric constant which periodically changes along the propagation direction.

Example 4

Figure 8A:
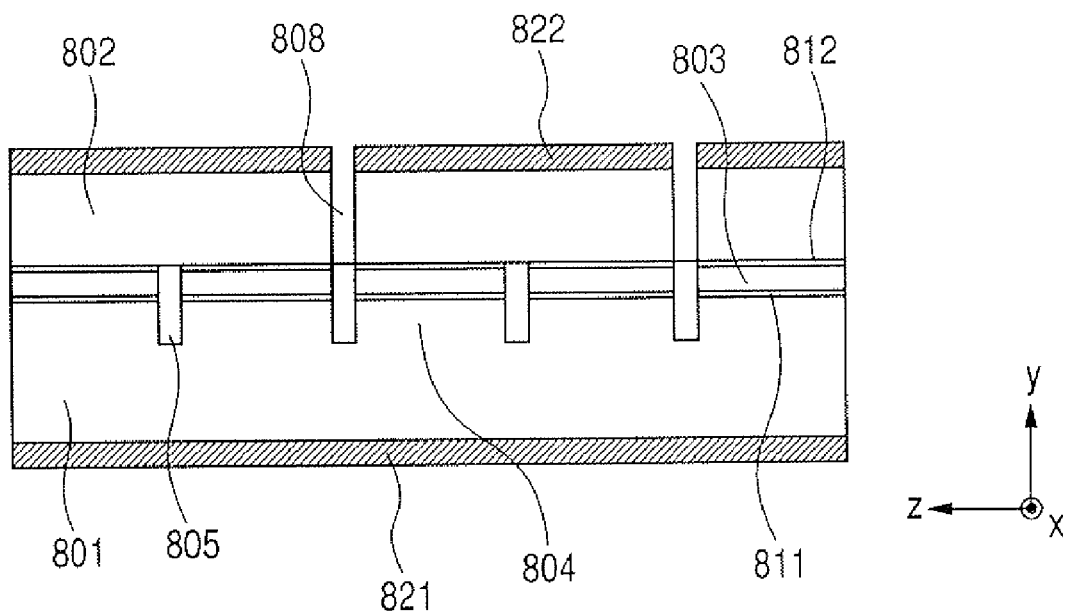
FIGS. 8A and 8B are cross sectional views illustrating a structure of a laser device according to Example 4.
Figure 8B:
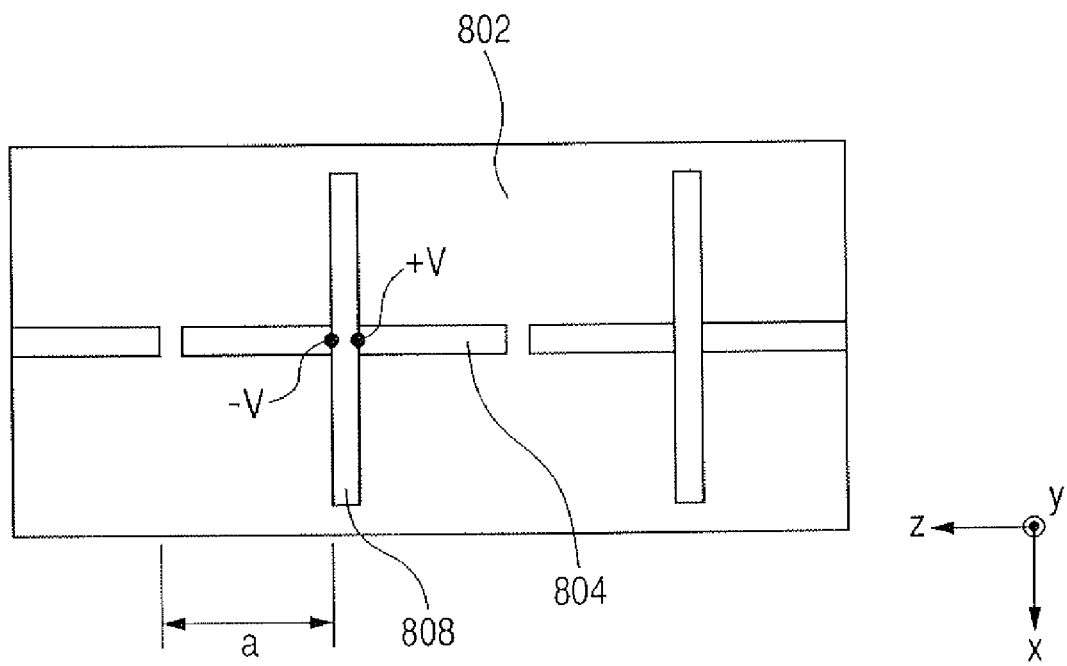

FIGS. 8A and 8B are cross sectional views illustrating Example 4 of a laser device according to the present invention. Example 4 is a laser device having a structure for guiding a laser output of Example 3 to a direction perpendicular to the propagation direction of the surface plasmon waveguide mode.

FIG. 8A is a cross sectional view of a y-z plane which includes a rib of FIG. 1, and the rib 804 has a width which periodically changes along the propagation direction. Furthermore, a negative dielectric constant medium 802 is provided with an opening 808, and then an electrode material 812 is also provided with an opening 808 accordingly. The opening 808 functions as a slot antenna which is well known in the antenna technology. That is, based on the surface potential of the negative dielectric constant medium 802, the electrical potential of the rib 804 is distributed in positive and negative along the propagation direction with a period of $\pi/\beta$. By contrast, based on the surface potential of the rib 804, the surface potential of the negative dielectric constant medium 802 is distributed in positive and negative along the propagation direction with a period of $\pi/\beta$.

Therefore, an opening 808 at an appropriate position on the negative dielectric constant medium 802 along the rib 804 enables to find an electric dipole between +V point and −V point of the opening 808. The distance between +V point and −V point can be much smaller compared to the wavelength, and in Example 4, the opening 808 is configured to have an antenna length which extends in the direction perpendicular to the propagation direction. FIG. 8B is a cross sectional view of an x-z plane including the opening 808 of Example 4, and illustrates the shape of the opening 808. The opening 808 of Example 4 is formed into a shape of a λ/2 antenna. According to a radiation pattern of a typical slot antenna, a laser output is obtained in a direction perpendicular to the propagation direction of the surface plasmon waveguide mode. There may be provided only one opening 808, but as in Example 4, a plurality of the openings 808 may be arranged in an array along the propagation direction with a period of 2a (=2π/β), which is required to obtain phases synchronization of the electromagnetic fields emitted from each opening 808. In FIG. 8A, the sections 801, 803, 805, 811, 821, and 822 correspond to the negative dielectric constant medium 701, the gain medium 703, the positive dielectric constant medium 705, the electrical contact 711, electrode material 721, and the electrode material 722 of FIGS. 7A and 7B, respectively.

The laser device having the opening 808 described above achieves a one-dimensional array structure. However, the laser device may have other structures. For example, a plurality of the ribs 804 may be arranged parallel to each other in order to propagate a surface plasmon waveguide mode at a pitch equal to the wavelength of the surface plasmon, which achieves a two-dimensional array structure in which the phases are synchronized in the same manner.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-150923, filed May 31, 2006, which is hereby incorporated by reference herein in its entirety.

What is claimed is:

1. A laser device comprising a waveguide with a resonant structure for resonating an electromagnetic wave, the waveguide including:
   a gain medium for generating the electromagnetic wave;
   a first cladding, which is in electrical contact with the gain medium, and which has a negative real part of a dielectric constant for the electromagnetic wave;
   a second cladding, which is in electrical contact with the gain medium, and which is provided on a side opposite to a side of the first cladding, such that the gain medium is sandwiched between the first and second claddings, and which has a negative real part of a dielectric constant for the electromagnetic wave; and
   a lateral structure, which is arranged so as to be in contact with at least one side surface of the gain medium, such that the lateral structure is sandwiched between the first and second claddings, and which has a positive real part of a dielectric constant for the electromagnetic wave,
   wherein a wavenumber of a surface plasmon held by the lateral structure is smaller than a wavenumber of a surface plasmon held by the gain medium.

2. The laser device according to claim 1, wherein at least one of: the first cladding and the second cladding includes at least one of: a metal and a carrier-doped semiconductor.

3. The laser device according to claim 1, wherein the lateral structure includes a dielectric material.

4. The laser device according to claim 1, wherein the waveguide has at least two end surfaces in the propagation direction of the electromagnetic wave to form the resonant structure, so that the end surfaces are used to reflect the electromagnetic wave to create a standing wave.

5. The laser device according to claim 4, wherein the end surfaces are provided with an impedance transformation structure, so that a portion of the standing wave is extracted to one of an exterior space and an exterior transmission line.

6. The laser device according to claim 1, wherein at least one of the first cladding and the second cladding is provided with a section having a dimension in the width direction that periodically changes along the propagation direction of the electromagnetic wave, so that Bragg reflection is used to change the electromagnetic wave into a standing wave.

7. The laser device according to claim 6, wherein one of the first cladding and the second cladding is provided with at least one opening, so that a part of the standing wave is extracted to one of an exterior space and an exterior transmission line.

8. The laser device according to claim 1, wherein the gain medium is a resonant tunneling diode based on photon-assisted tunneling.

9. The laser device according to claim 1, wherein the gain medium has a thickness that is one tenth or less of a wavelength of the electromagnetic wave.

10. The laser device according to claim 1, wherein the electromagnetic wave has a frequency that includes a portion in a frequency range from 30 GHz to 30 THz.

11. A laser device comprising:
   a gain medium that has a gain for an electromagnetic wave, a frequency of the electromagnetic wave including a portion in a frequency range from 30 GHz to 30 THz,
   wherein the gain medium extends in a propagation direction of the electromagnetic wave and, at top and bottom surfaces in a thickness direction thereof, is in electrical contact with and sandwiched between a first cladding and a second cladding each of which includes: (i) a negative dielectric constant medium with a negative real part of a dielectric constant for the electromagnetic wave, and (ii) an electrical contact that is in contact with the gain medium,
   wherein the gain medium is provided with a lateral structure adjacent to at least one side surface of the gain medium in a width direction perpendicular to the propagation direction of the electromagnetic wave and the thickness direction, the lateral structure being configured so that a positive dielectric constant medium with a positive real part of a dielectric constant for the electromagnetic wave is sandwiched, at top and bottom surfaces in a thickness direction thereof, between negative dielectric constant media with a negative real part of the dielectric constant for the electromagnetic wave, and
   wherein the gain medium, the lateral structure, the first cladding, and the second cladding constitute a waveguide for propagating the electromagnetic wave, and the waveguide includes a resonant structure for resonating the electromagnetic wave.

12. A laser device comprising:
   a gain medium that has a gain for an electromagnetic wave, a frequency of the electromagnetic wave including a portion in a frequency range from 30 GHz to 30 THz;
   wherein the gain medium extends in a propagation direction of the electromagnetic wave and, at top and bottom surfaces in a thickness direction thereof, is in electrical contact with and sandwiched between a first cladding and a second cladding each of which includes: (i) a metal with a negative real part of a dielectric constant for the electromagnetic wave, and (ii) an electrical contact that is in contact with the gain medium,
   wherein the gain medium is provided with a lateral structure adjacent to at least one side surface of the gain medium in a width direction perpendicular to the propagation direction of the electromagnetic wave and the thickness direction, the lateral structure being configured so that a dielectric material with a positive real part of a dielectric constant for the electromagnetic wave is sandwiched, at top and bottom surfaces in a thickness direction thereof, between metals with a negative real part of the dielectric constant for the electromagnetic wave, and wherein the gain medium, the lateral structure, the first cladding, and the second cladding constitute a waveguide for propagating the electromagnetic wave, and the waveguide includes a resonant structure for resonating the electromagnetic wave.

13. A laser device comprising:

a gain medium that has a gain for an electromagnetic wave;

wherein the gain medium extends in a propagation direction of the electromagnetic wave and, at top and bottom surfaces in a thickness direction thereof, is in electrical contact with and sandwiched between a first cladding and a second cladding each of which includes: (i) a semiconductor carrier-doped so as to have a negative real part of a dielectric constant for the electromagnetic wave, and (ii) an electrical contact that is in contact with the gain medium, wherein the gain medium is provided with a lateral structure adjacent to at least one side surface of the gain medium in a width direction perpendicular to the propagation direction of the electromagnetic wave and the thickness direction, the lateral structure being configured so that a dielectric material with a positive real part of a dielectric constant for the electromagnetic wave is sandwiched, at top and bottom surfaces in a thickness direction thereof, between semiconductors carrier-doped so as to have a negative real part of the dielectric constant for the electromagnetic wave, and wherein the gain medium, the lateral structure, the first cladding, and the second cladding constitute a waveguide for propagating the electromagnetic wave, and wherein the waveguide includes a resonant structure for resonating the electromagnetic wave.

14. The laser device according to claim 1, wherein the lateral structure is formed of a material having a dielectric constant smaller than that of the gain medium.

15. The laser device according to claim 1, wherein the lateral structure has a thickness larger than that of the gain medium.

16. The laser device according to claim 1, wherein each of the first and second claddings includes an electrical contact that is in contact with the gain medium.

* * * * *